United States Patent
Suzuki (10) Patent No.: US 7,280,404 B2
(45) Date of Patent: Oct. 9, 2007

(54) NONVOLATILE SEMICONDUCTOR MEMORY DEVICE THAT ERASES STORED DATA AFTER A PREDETERMINED TIME PERIOD WITHOUT THE USE OF A TIMER CIRCUIT

(75) Inventor: Atsuhiro Suzuki, Tachikawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/087,735

(22) Filed: Mar. 24, 2005

(65) Prior Publication Data

US 2006/0028871 A1 Feb. 9, 2006

Related U.S. Application Data

(63) Continuation of application No. PCT/JP03/02271, filed on Feb. 27, 2003.

(51) Int. Cl.
G11C 11/34 (2006.01)
G11C 16/06 (2006.01)
G11C 16/04 (2006.01)

(52) U.S. Cl. .................. 365/185.2; 365/185.29

(58) Field of Classification Search ............ 365/185.2, 365/185.21, 185.22, 185.29, 185.33, 185.04, 365/185.11, 210, 218, 189.07; 711/103; 726/26–33
See application file for complete search history.

(56) References Cited

U.S. PATENT DOCUMENTS 6,094,368 A * 7/2000 Ching ................... 365/49

6,249,460 B1 * 6/2001 Forbes et al. .......... 365/185.28
6,260,103 B1 * 7/2001 Alexis et al. ............ 711/103
6,754,548 B1 * 6/2004 Yoshii et al. ............. 700/94
6,799,256 B2 * 9/2004 Van Buskirk et al. ...... 711/156
6,856,581 B1 * 2/2005 Berstis et al. ............ 368/121

FOREIGN PATENT DOCUMENTS

| EP | 1 081 577 A2 | 3/2001 |
| JP | 2001-67794 A | 3/2001 |
| JP | 2001-117824 A | 4/2001 |
| JP | 2002-246887 A | 8/2002 |

OTHER PUBLICATIONS

N. Horiguchi et al; "A Direct Tunneling Memory (DTM) Utilizing Novel Floating Gate Structure"; Technical Digest of International Electron Devices Meeting; 1999; U.S..; IEEE; p. 922.
Tatsuya Usuki et al; "Advantage of a Quasi-Nonvolatile Memory with Ultra Thin Oxide"; Abstract of International Conference on Solid State Devices and Materials; 2001, The Japan Society of Applied Physics, p. 532.

* cited by examiner

Primary Examiner—Tuan T. Nguyen
Assistant Examiner—Allison P Bernstein
(74) Attorney, Agent, or Firm—Arent Fox LLP.

(57) ABSTRACT

A nonvolatile semiconductor memory device is characterized by including a memory cell to store data, a first reference cell, a check circuit to check a threshold of the first reference cell, and an erase circuit to erase the data of the memory cell in response to detection by the check circuit that the threshold of the first reference cell is smaller than or substantially equal to a predetermined fixed value.

21 Claims, 7 Drawing Sheets

| V1 | V2 | Vout |
|---|---|---|
| L | L | Vin × R3/(R1+R2+R3) |
| L | H | Vin × R3/(R1+R3) |
| H | L | Vin × R3/(R2+R3) |
| H | H | Vin |

FIG.7

| Vwl | 5.0V>Vwl_ref VOLTAGE |
|---|---|
| Vbl | ABOUT 0.1 V ~ 2 V |
| Vwl_ref | 1.0V~5V < Vwl VOLTAGE |
| Vbl_reg | ABOUT 0.1 V ~ 2 V |

FIG.8

NONVOLATILE SEMICONDUCTOR MEMORY DEVICE THAT ERASES STORED DATA AFTER A PREDETERMINED TIME PERIOD WITHOUT THE USE OF A TIMER CIRCUIT

CROSS-REFERENCE TO RELATED APPLICATION

This is a continuation of International Application No. PCT/JP2003/002271, filed on Feb. 27, 2003, the entire contents of which are hereby incorporated by reference.

BACKGROUND OF THE INVENTION

1. Field of the Invention

The present invention generally relates to semiconductor memory devices, and particularly relates to a nonvolatile semiconductor memory device that uses nonvolatile memory cells.

2. Description of the Related Art

There are cases in which it is not desirable to let users use the data stored in memory indefinitely for reasons relating to copyright or the like. Such cases may include the case in which music or image information is temporarily downloaded by use of a portable terminal, the case in which free sample data is used for a limited time period, the case in which software with an expiration date for use is used, etc.

In order to erase all the stored data after a predetermined time period in a flash memory that is a nonvolatile semiconductor memory device, a timer circuit is generally provided inside the device for the purpose of timekeeping. When the data retention period is a long period such as one month, however, a circuit of enormous size is required to implement the timer that can time such a long time period. Such configuration is difficult to implement as a semiconductor device.

Accordingly, the present invention is aimed at providing a nonvolatile semiconductor memory device that can erase stored data after a predetermined time period without the use of a timer circuit.

Non-patent Documents 1 and 2 disclose the background technology of the present invention.

Non-Patent Document 1

Horiguchi and five others, "A Direct Tunneling Memory (DTM) Utilizing Novel Floating Gate Structure," Technical Digest of International Electron Devices Meeting 1999, U.S., IEEE, p 922

Non-Patent Document 2

Usuki and two others, "Advantage of a quasi-nonvolatile memory with ultra thin oxide," Abstract of International Conference on Solid State Devices and Materials 2001, The Japan Society of Applied Physics, p 532

SUMMARY OF THE INVENTION

A nonvolatile semiconductor memory device according to the present invention is characterized by including a memory cell to store data, a first reference cell, a check circuit to check a threshold of the first reference cell, and an erase circuit to erase the data of the memory cell in response to detection by the check circuit that the threshold of the first reference cell is smaller than or substantially equal to a predetermined fixed value.

According to another aspect of the present invention, the nonvolatile semiconductor memory device as described above is characterized by further including a second reference cell, wherein the check circuit checks the threshold of the first reference cell by comparing a cell current of the first reference cell with a cell current of the second reference cell.

According to another aspect of the present invention, the nonvolatile semiconductor memory device as described above is characterized by further including a control circuit configured to set the threshold of the first reference cell at a value larger than the predetermined fixed value by performing an operation for programming the first reference cell in conjunction with an operation for writing the data to the memory cell.

According to another aspect of the present invention, the nonvolatile semiconductor memory device as described above is characterized in that the control circuit adjusts an amount of electric current programmed to the first reference cell in response to an input from an exterior of the nonvolatile semiconductor memory device.

In this manner, the nonvolatile semiconductor memory device according to the present invention not only writes data to the memory cell array at the time of data writing operation, but also writes electric charge to the first reference cell in the amount corresponding to a desired time period. Between the first reference cell and the second reference cell, the cell currents are compared at predetermined time intervals, for example. If the difference in the amount of electric currents disappears, it is ascertained that the desired time period has passed. That is, the desired time period is believed to have passed if the electric charge held by the floating gate decreases to become substantially zero due to charge loss in the first reference cell, to which electric charge was written. In other words, the threshold of the first reference cell is checked, and it is ascertained that the desired time period has passed if the threshold of the first reference cell becomes smaller than or substantially equal to the predetermined value. In response to such finding, the erase circuit is activated to erase data in the memory cell array.

Accordingly, the present invention successfully provides a nonvolatile semiconductor memory device that can automatically erase stored data after the passage of a desired time period without the use of a large-scale timer circuit.

In order to provide a nonvolatile semiconductor memory device in which stored contents disappear after a specified time period, the present invention utilizes, as a memory cell, a transistor having the tunnel oxide film that is thinner than the tunnel oxide film of conventional flash memories where the tunnel oxide film separates the floating gate from the channel of the flash memory.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

In order to provide a nonvolatile semiconductor memory device in which stored contents disappear after a predetermined time period, the present invention utilizes, as a memory cell, a transistor having the tunnel oxide film that is thinner than the tunnel oxide film of conventional flash memories where the tunnel oxide film separates the floating gate from the channel of the flash memory. In the memory cell having such a thin tunnel oxide film, the injection and releasing of electrons are performed with respect to the floating gate by use of a physical phenomenon called "direct tunneling". Hereinafter, a memory device utilizing a physical phenomenon of direct tunneling is referred to as a direct tunneling memory (DTM). While the thickness of the tunnel oxide film in the conventional flash memories is approximately 9.0 nm to 10.0 nm, the DTM has a tunnel oxide film having a thickness of approximately 5.0 nm or less.

The DTM provides for high-speed write/erase operations to be performed at lower voltage than the conventional flash memories. In addition, the DTM is characterized by its short data retention time. A data retention period of 60 days, for example, may be achieved at the maximum.

The present invention positively utilizes the feature of the DTM that its data retention period is relatively short, thereby achieving a nonvolatile semiconductor memory device in which stored data contents are automatically erased after the passage of a specified time period. Since the DTM allows high-speed write/erase operations to be performed at a low voltage as described above, the nonvolatile semiconductor memory device of the present invention provides advantages of low power consumption and high-speed operation. As will be described later, the length of a data retention period is adjusted by the amount of electric charge injected into the floating gate at the time of data writing.

Figure 1:
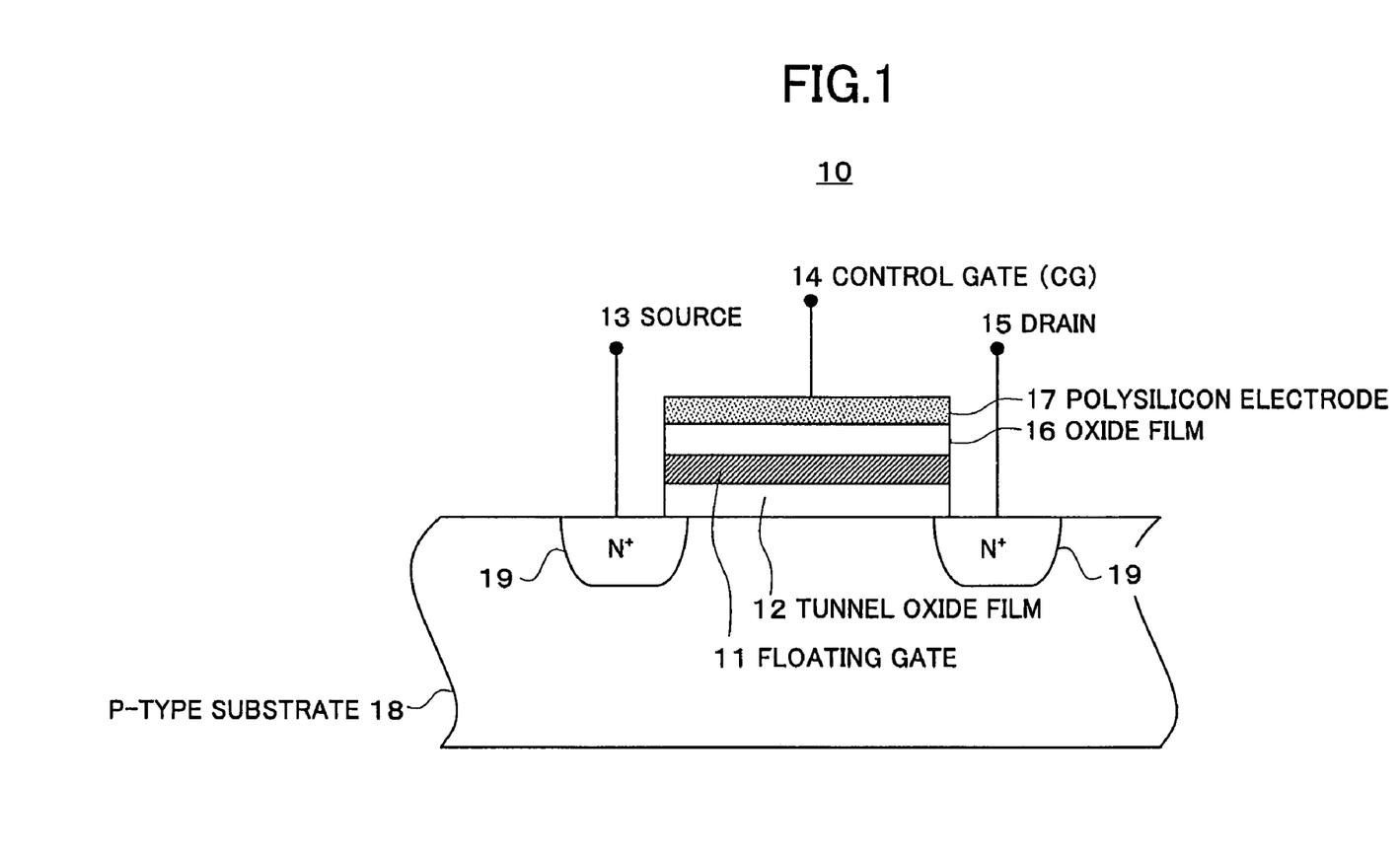
FIG. 1 is a drawing showing an example of the structure of a DTM cell.

FIG. 1 is a drawing showing an example of the structure of a DTM cell.

A DTM cell 10 of FIG. 1 includes a floating gate 11, a tunnel oxide film 12, a source 13, a control gate 14, a drain 15, an oxide film 16, and a polysilicon electrode 17. In the DTM cell 10, a source and drain are formed in a semiconductor substrate of a first conduction type (i.e., a P-type semiconductor substrate 18 in the example of FIG. 1) by using a semiconductor diffusion layer of a second conduction type (i.e., an N-type diffusion layer 19 in FIG. 1).

The thickness of a tunnel oxide film in the conventional flash memories is about 9 nm to 10 nm. The tunnel oxide film 12 of the DTM 10 according to the present invention has a thickness of approximately 5 nm or less, thereby enabling data writing and erasing that utilize the direct tunneling phenomenon. The thickness of the tunnel oxide film 12 may preferably be about 1.5 nm to 3.0 nm.

Figure 2:
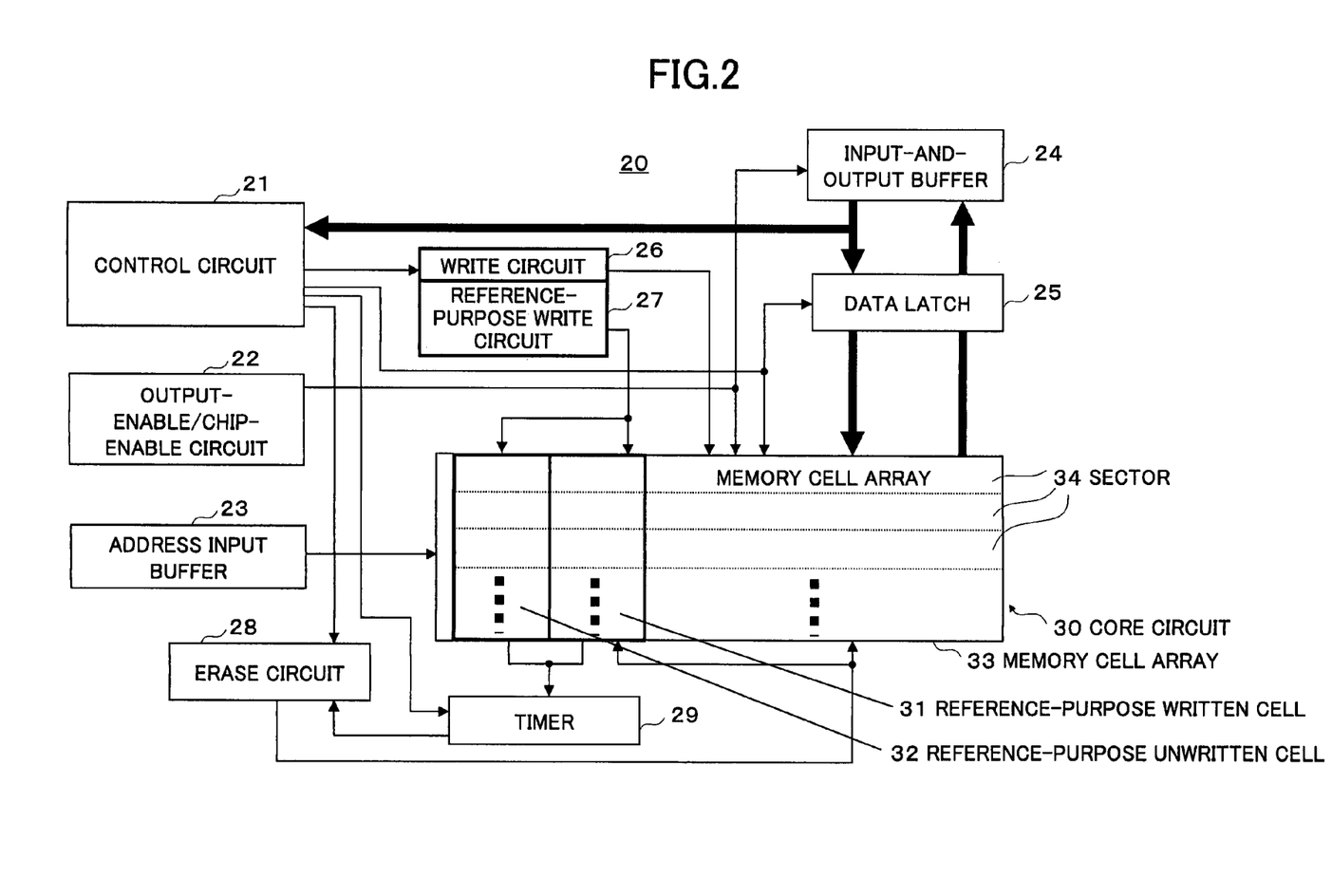
FIG. 2 is a block diagram showing an example of the construction of the nonvolatile semiconductor memory device according to the present invention.

FIG. 2 is a block diagram showing an example of the construction of the nonvolatile semiconductor memory device according to the present invention.

A nonvolatile semiconductor memory device 20 of FIG. 2 includes a control circuit 21, an output-enable/chip-enable circuit 22, an address input buffer 23, an input-and-output buffer 24, a data latch 25, a write circuit 26, a reference-purpose write circuit 27, an erase circuit 28, a timer 29, and a core circuit 30. The core circuit 30 includes a memory cell array having DTM cells shown in FIG. 1 arranged in matrix form, reference cells comprised of DTM cells, an X decoder for selecting a position in the word direction, a Y decoder for selecting a position in the column direction, etc. FIG. 2 illustrates a reference-purpose written cell 31, a reference-purpose unwritten cell 32, and a memory cell array 33 serving as an area for storing write/read data. The memory cell array 33 includes a plurality of sectors 34.

The control circuit 21 is a state machine for controlling the entirety of the nonvolatile semiconductor memory device 20. In response to a control command supplied from the exterior, the control circuit 21 selects a read operation, a write operation, or an erase operation, and controls each circuit portion of the nonvolatile semiconductor memory device 20 to carry out the selected operation.

When a read operation is selected, the core circuit 30 and the data latch 25 are placed in a standby state first by an output-enable/chip-enable operation performed by the output-enable/chip-enable circuit 22. Data of the cells specified by an address stored in the address input buffer 23 is output to the exterior of the device through the data latch 25 and the input-and-output buffer 24 separately for each minimum memory cell unit such as a byte unit or a sector unit.

When a data write operation is selected, the write circuit 26 supplies a write voltage to the memory cell array 33, thereby writing to the memory cell array 33 data supplied to the data latch 25 from the exterior through the input-and-output buffer 24. At the same time, the reference-purpose write circuit 27 for controlling a data storage period writes electric charge to the reference-purpose written cell 31 in amount corresponding to a desired data retention period.

In the data write operation, the control circuit 21 controls the write operation such that data writing and the setting of a retention period can be performed on a minimum-memory-cell-unit-specific basis such as a sector-specific basis. In order to set the retention period on a sector-specific basis, the reference-purpose written cell 31 and the reference-purpose unwritten cell 32 are provided with respect to each sector 34.

When a data erase operation is selected, the erase circuit 28 supplies an erase voltage to the memory cell array 33, thereby erasing data stored in the memory cells in a lump on a sector-specific basis. The timer 29 operates at predetermined time intervals, for example. The timer 29 compares the cell current of the reference-purpose written cell 31 with the cell current of the reference-purpose unwritten cell 32. A check is made based on the result of the comparison as to whether a desired time period has passed. If it is ascertained that the period has passed, the erase circuit 28 is activated to erase data in the memory cell array 33.

When data in the memory cells is erased, the reference-purpose written cell 31 is refreshed in association with the erase operation. This makes sure that no electric charge remains in the reference-purpose written cell 31.

In this manner, the nonvolatile semiconductor memory device according to the present invention not only writes data to the memory cell array 33 at the time of data writing operation, but also writes electric charge to the reference-purpose written cell 31 in the amount corresponding to the desired time period. Between the reference-purpose written cell 31 and the reference-purpose unwritten cell 32, the cell currents are compared at predetermined time intervals, for example. If the difference in the amount of electric currents disappears, it is ascertained that the desired time period has passed. That is, the desired time period is believed to have passed if the electric charge held by the floating gate 11 decreases to become substantially zero due to charge loss in the reference-purpose written cell 31. In other words, the threshold of the reference-purpose written cell 31 is checked, and it is ascertained that the desired time period has passed if the threshold of the reference-purpose written cell 31 becomes smaller than a predetermined value. In response to such finding, the erase circuit is activated to erase data in the memory cell array.

Accordingly, the present invention can provide a nonvolatile semiconductor memory device that automatically erases stored data after the passage of a desired time period without the use of a large-scale timer circuit.

Figure 3:
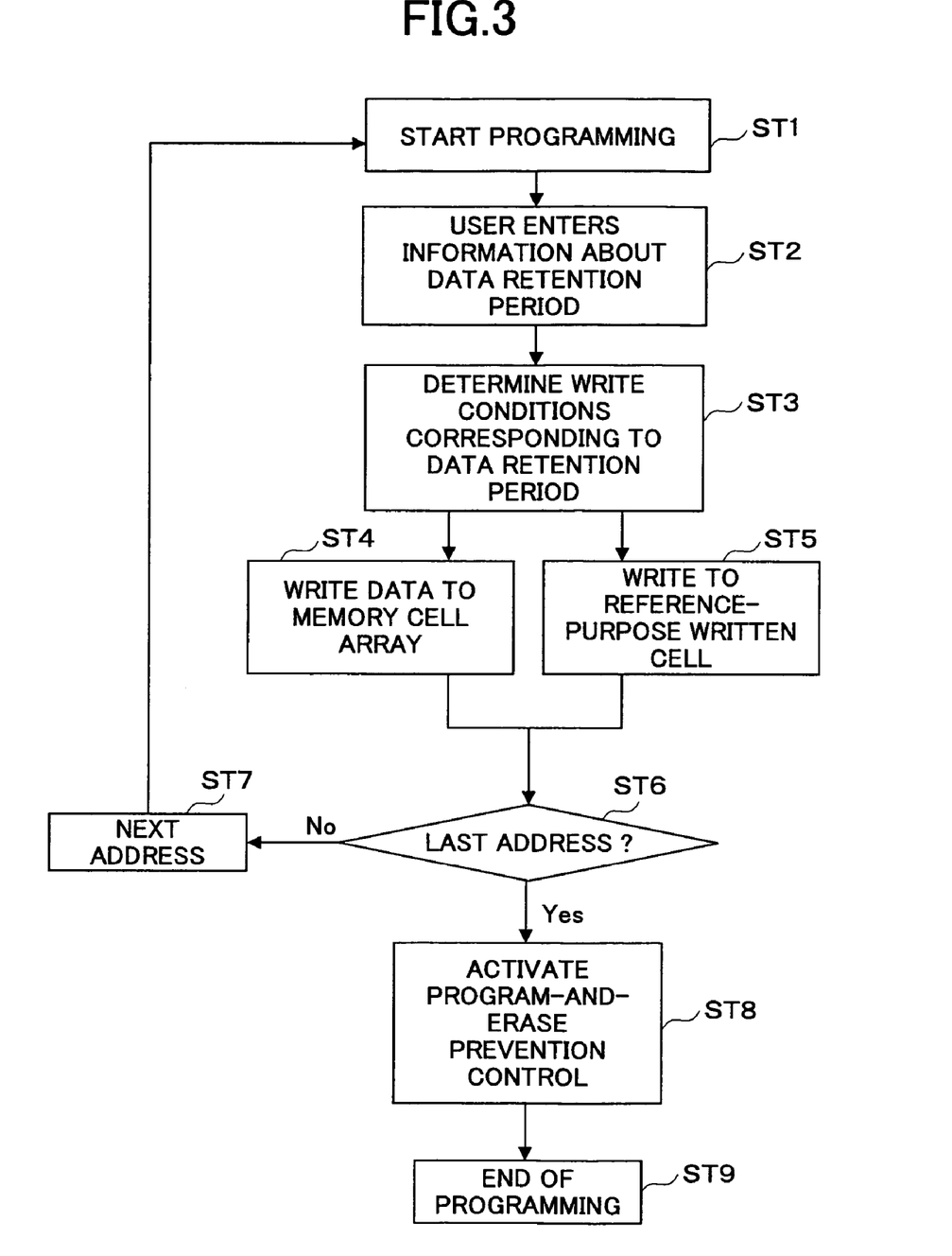
FIG. 3 is a flowchart showing the procedure of a write operation according to the present invention.

FIG. 3 is a flowchart showing the procedure of a write operation according to the present invention.

At step ST1, a programming operation (write operation) starts.

At step ST2, a data retention period is entered into the nonvolatile semiconductor memory device 20 by use of a user command. If a data retention period of 10 days is to be specified, for example, a code or the like indicative of 10 days is entered. If a data retention period of one month is to be specified, for example, a code or the like indicative of one month is entered.

At step ST3, write conditions corresponding to the specified data retention period that is entered are determined. As previously described, the data retention period is controlled by the amount of electric charge injected to the reference-purpose written cell 31. Write conditions P1, P2, P3, ..., for example, perform writing by use of drain voltages a1, a2, a3, ... V, source voltages b1, b2, b3, ... V, control gate voltages (word-line voltages) C1, C2, C3, ... V, and substrate voltages D1, D2, D3, ... V, by spending a write time t1, t2, t3, ... sec, respectively. It is then assumed that the memory retention time of the DTM cell is X1, X2, X3, ... with respect to the write conditions P1, P2, P3, ..., respectively.

If the specified data retention period is time X1, write conditions are determines such that electric charge is injected into the reference-purpose written cell 31 under the write condition P1. If the specified data retention period is time X3, write conditions are determines such that electric charge is injected into the reference-purpose written cell 31 under the write condition P3. Here, the amount of electric charge injection is controllable by the voltage conditions at the time of writing and by the number of pulses that are applied to the control gate.

At step ST4, data writing to the memory cell array 33 (sector 34) is performed. Here, the memory cell array 33 serving as a data storage area is also comprised of an array of DTM cells. If the amount of electric charge injection at the time of writing is small, therefore, the data of substance may disappear before the passage of the specified date retention period. When data is written to the memory cell array 33 (sector 34), the maximum amount of electric charge is injected so as to achieve the longest data retention time.

At step ST5, electric charge is injected into the reference-purpose written cell 31 under the conditions corresponding to the specified data retention period. The operation at step ST5 is performed at the same time as the operation at step ST4 (i.e., as a series of continuous operations).

At step ST6, a check is made as to whether the current write address is the last specified address. If it is the last address, the address is incremented to the next address at step ST7, and the procedure returns to step ST1 to perform a programming operation. In this manner, it is possible to write data separately for each minimum unit (e.g., for each sector) while setting a data retention period separately for each unit.

If the check at step ST6 finds that the current address is the last address, a program/erase preventing control is put into effect at step ST8. With this provision, a new programming operation or erase operation will be prevented with respect to the area that was written as described above.

At step ST9, the programming operation comes to an end.

Figure 4:
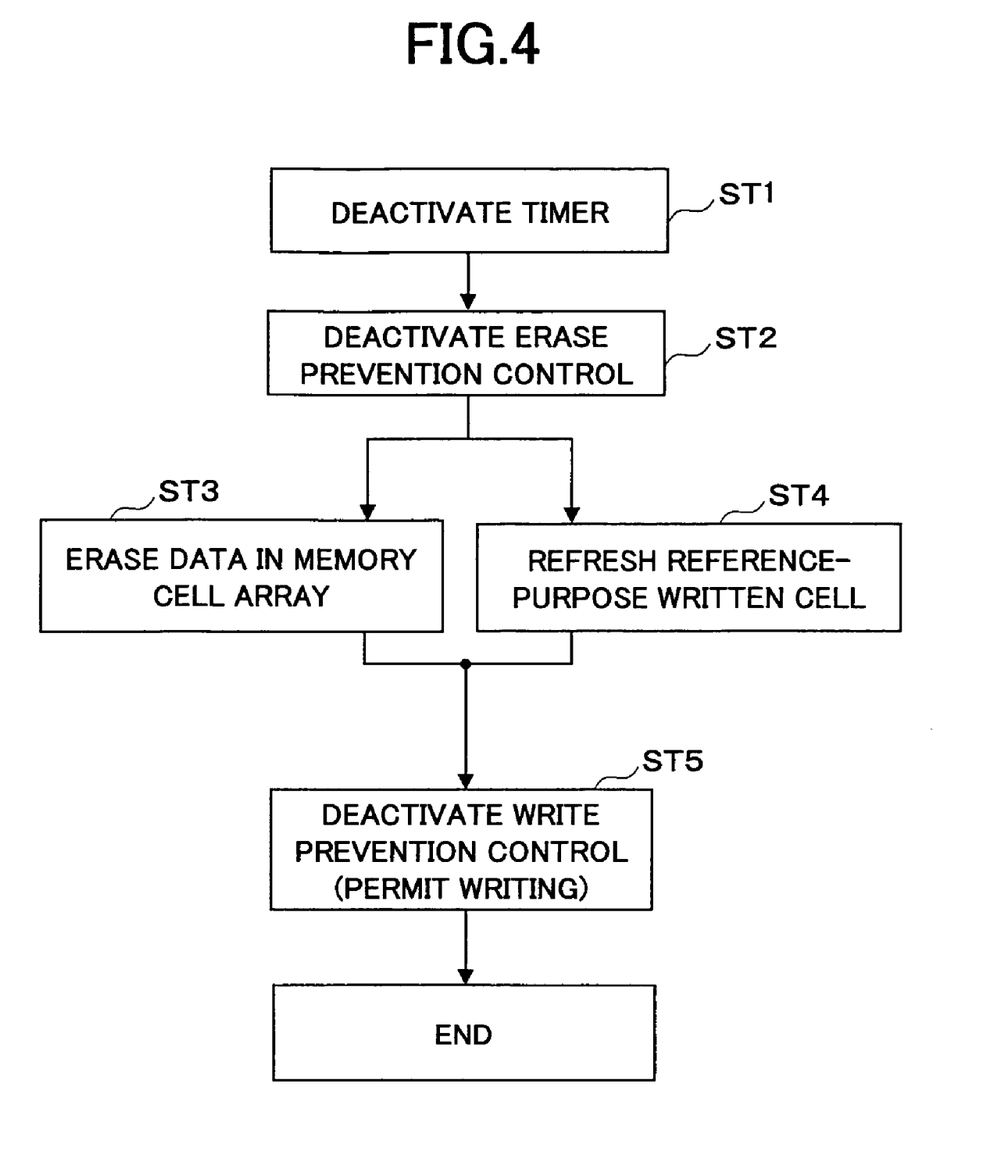
FIG. 4 is a flowchart showing the procedure of an erase operation according to the present invention.

FIG. 4 is a flowchart showing the procedure of an erase operation according to the present invention.

At step ST1, the operation of the timer is stopped. Namely, in the event that the timer 29 of FIG. 2 detects the passage of a specified data retention period, further timer operation becomes unnecessary, so that the timer operation is stopped.

At step ST2, an erase prevention control is deactivated.

At step ST3, the data in the memory cell array 33 is erased. That is, the data stored in the sector 34 is erased.

At step ST4, the reference-purpose written cell 31 is refreshed. Namely, the reference-purpose written cell 31 is erased so that no electric charge remains in the reference-purpose written cell 31.

At step ST5, the write preventing control is deactivated, thereby setting a state in which write operations are permitted. This is because the program preventing control was put into effect at step ST8 of FIG. 3 to set up the state in which no new write operation could be performed. There is thus a need to disengage from this state.

With this, an erase operation comes to an end.

Figure 5:
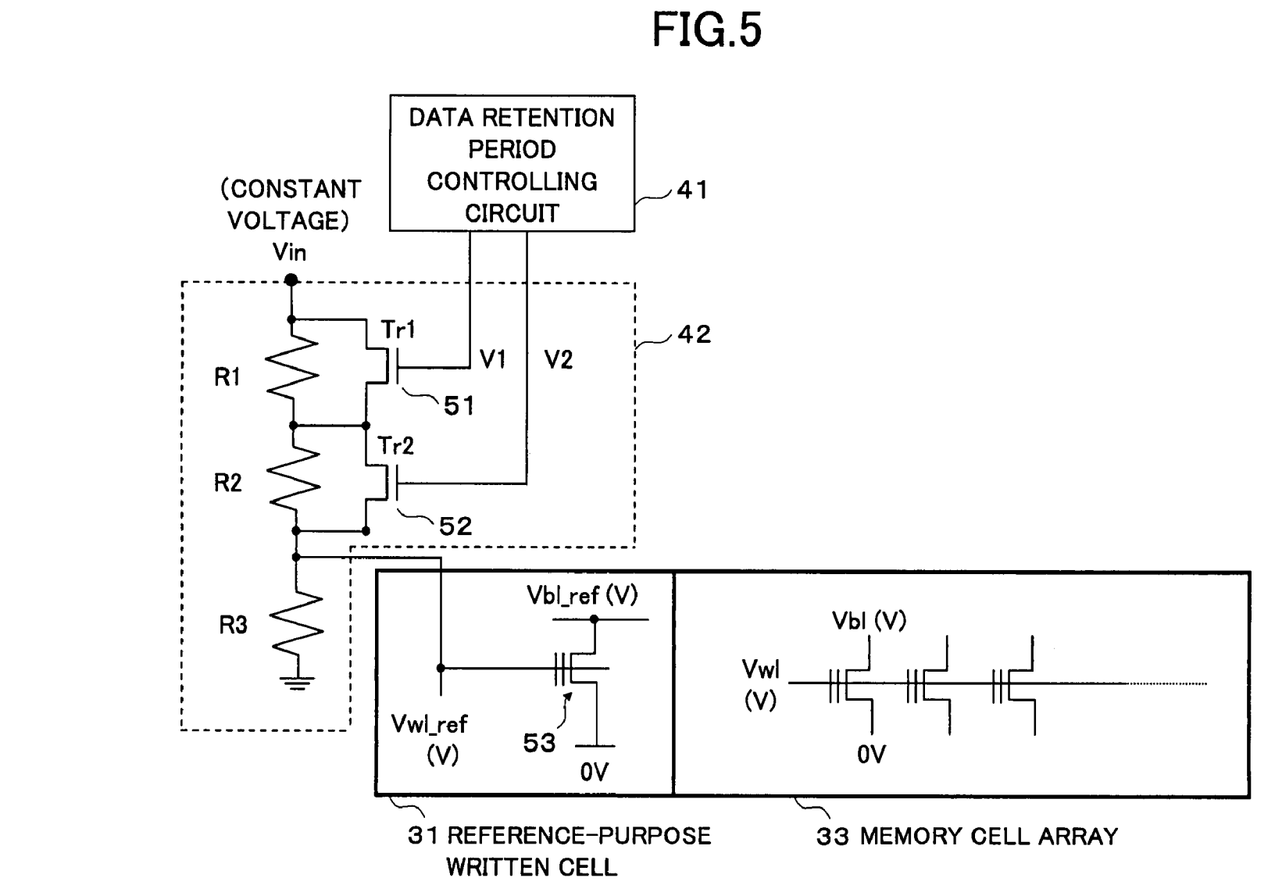
FIG. 5 is a drawing showing an example of the schematic construction of a reference-purpose write circuit and a reference-purpose written cell according to the present invention.

FIG. 5 is a drawing showing an example of the schematic construction of the reference-purpose write circuit 27 and the reference-purpose written cell 31 according to the present invention.

In FIG. 5, a data retention period controlling circuit 41 and a voltage regulator 42 are equivalent to the reference-purpose write circuit 27 of FIG. 2. The data retention period controlling circuit 41 operates under the control of the control circuit 21 of FIG. 2 to supply a signal corresponding to the specified data retention period to the voltage regulator 42. In this example, the signal is comprised of two bits, i.e., voltages V1 and V2. The voltage regulator 42 includes NMOS transistors 51 and 52 and resistors R1 through R3. The gate node of the NMOS transistor 51 receives the voltage signal V1 from the data retention period controlling circuit 41. The gate node of the NMOS transistor 52 receives the voltage signal V2 from the data retention period controlling circuit 41. The voltage regulator 42 divides a voltage Vin by use of a resistor series comprised of the resistors R1 through R3 in response to HIGH or LOW of the voltage signals V1 and V2, thereby producing an output voltage.

Figure 6:
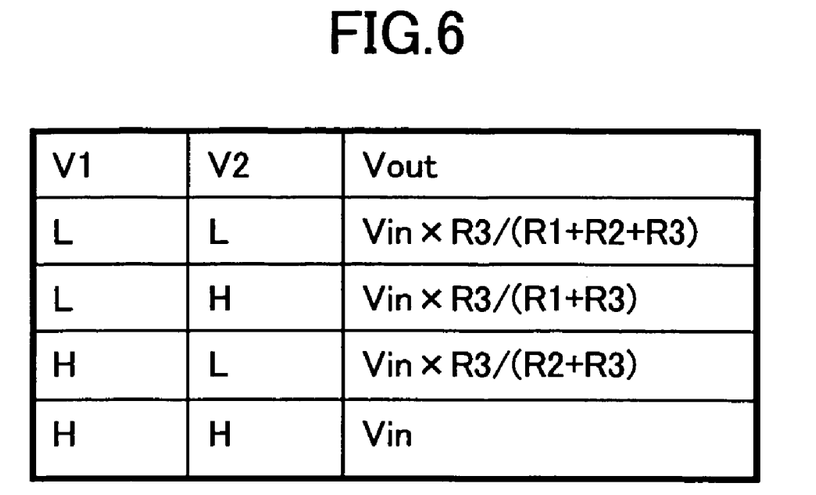
FIG. 6 is a drawing showing the voltage generated by a voltage regulator with respect to the four cases specified by two bits.

FIG. 6 is a drawing showing the voltage generated by the voltage regulator 42 with respect to the four cases specified by two bits. As shown in FIG. 6, when the voltage signals V1 and V2 are HIGH and LOW, respectively, the output voltage of the voltage regulator 42 becomes Vin×R3/(R2+R3). The output voltage generated in this manner is supplied to the reference-purpose written cell 31.

The two-bit configuration was used in the above example. Alternatively, information input terminals corresponding to N bits may be provided in the nonvolatile semiconductor memory device 20, thereby providing write conditions corresponding to $2^N$ combinations.

With reference to FIG. 5 again, the output voltage of the voltage regulator 42 is supplied to the reference-purpose written cell 31 to be applied to the word line (control node) of a reference cell 53. It should be noted that a word-line potential Vwl(V) for writing to the memory cells of the memory cell array 33 is always set to a higher potential than a word-line potential Vwl_ref(V) of the reference cell 53. This is aimed at avoiding early disappearance of data of substance before the end of the specified data retention period as described above.

Figure 7:
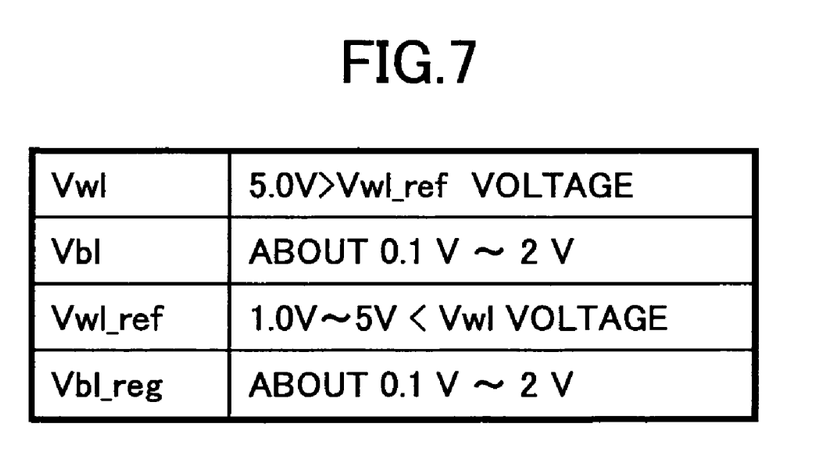
FIG. 7 is a drawing showing examples of individual applied voltages used in the configuration of FIG. 5.

FIG. 7 is a drawing showing examples of individual applied voltages used in the configuration of FIG. 5.

As shown in FIG. 7, the word-line potential Vwl(V) for writing to the memory cells of the memory cell array 33 is 5 V, which is higher than the word-line potential Vwl_ref(V) of the reference cell 53 that is adjusted within a range from 1 V to 5 V. Further, a drain-node voltage Vbl(V) of a memory cell is set to approximately 0.1 V to 2 V, and a drain-node voltage Vbl_ref(V) of the reference cell 53 is also set to approximately 0.1 V to 2 V.

Figure 8:
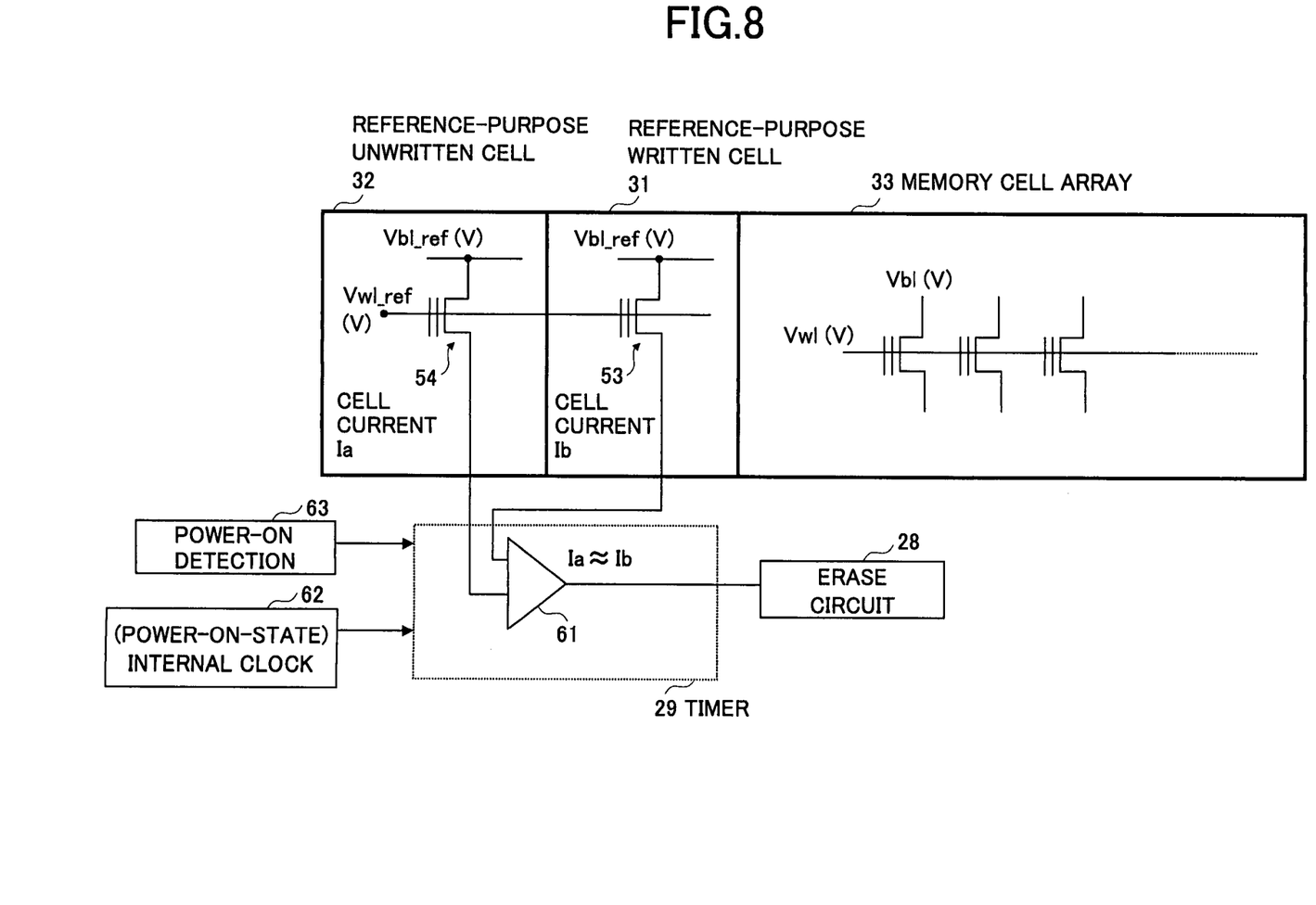
FIG. 8 is a drawing showing an example of the schematic configuration of a timer.

FIG. 8 is a drawing showing an example of the schematic configuration of the timer.

The timer 29 includes an electric current comparator 61. The electric current comparator 61 compares a cell current Ia from a reference cell 54 of the reference-purpose unwritten cell 32 with a cell current Ib from the reference cell 53 of the reference-purpose written cell 31. When the cell current Ia and the cell current Ib become substantially equal, a signal indicative of an erase operation is supplied to the erase circuit 28.

In an initial state, the reference cell 53 of the reference-purpose written cell 31 is placed in a programmed state with injected electric charge, so that the cell current Ib is close to zero. Accordingly, Ib<Ia, and the output signal of the electric current comparator 61 is not asserted. As time passes thereafter, the electric charge stored in the reference cell 53 decreases due to charge loss. The larger the amount of electric charge initially injected, the longer the time period before the complete disappearance of the electric charge. After the passage of a predetermined time, the initially injected electric charge is almost completely lost, resulting in the cell current Ia being equal to the cell current Ib. The electric current comparator 61 detects this, thereby triggering an erase operation.

The timing at which the electric current comparator 61 operates may be arranged at predetermined intervals specified by an internal clock 62 of the nonvolatile semiconductor memory device 20, for example. When the power of the device is in an ON state (i.e., in the state in which the internal clock 62 is active), the comparison of the electric currents is performed once in every minute, for example. Further, provision may be made such that a power-on detecting circuit 63 detects the power-on of the nonvolatile semiconductor memory device 20, prompting the electric current comparator 61 to operate each time the power is tuned on. Provision may be further made such that the electric current comparator 61 only operates either at the predetermined intervals specified by the internal clock 62 or at the time of the power-on detected by the power-on detecting circuit 63. Alternatively, provision may be made such that the electric current comparator 61 operates both at the timing of the power-on and at the predetermined intervals that follow.

Although the present invention has been described with reference to embodiments, the present invention is not limited to these embodiments. Various variations and modifications may be made without departing from the scope of the claimed invention.

What is claimed is:

1. A nonvolatile semiconductor memory device, characterized by comprising:
   a memory cell to store data;
   a first reference cell;
   a second unwritten reference cell;
   a check circuit to check a threshold of said first reference cell by comparing a cell current of said first reference cell with a cell current of the second unwritten reference cell; and
   an erase circuit to erase the data of said memory cell in response to detection by said check circuit that the threshold of said first reference cell is smaller than or substantially equal to a predetermined fixed value.

2. The nonvolatile semiconductor memory device as claimed in claim 1, wherein the nonvolatile semiconductor memory device is housed on a terminal selected from the group consisting of a personal computer, a minicomputer, a main frame computer, a microcomputer, a hand held device, and a telephonic device.

3. The nonvolatile semiconductor memory device as claimed in claim 1, characterized by further comprising a control circuit configured to set the threshold of said first reference cell at a value larger than the predetermined fixed value by performing an operation for programming said first reference cell in conjunction with an operation for writing the data to said memory cell.

4. The nonvolatile semiconductor memory device as claimed in claim 3, characterized in that said control circuit adjusts an amount of electric current programmed to said first reference cell in response to an input from an exterior of said nonvolatile semiconductor memory device.

5. The nonvolatile semiconductor memory device as claimed in claim 1, characterized in that said first reference cell includes: a substrate; a tunnel oxide film formed on said substrate; and a floating gate formed on said tunnel oxide film, wherein a thickness of said tunnel oxide film is 5.0 nm or less.

6. The nonvolatile semiconductor memory device as claimed in claim 5, characterized in that said memory cell includes: a tunnel oxide film of said memory cell formed on said substrate; and a floating gate formed on said tunnel oxide film of said memory cell, wherein a thickness of said tunnel oxide film of said memory cell is 5.0 nm or less.

7. The nonvolatile semiconductor memory device as claimed in claim 1, further comprising:
   an internal clock that specifies predetermined time intervals at which said check circuit checks the threshold of said first reference cell.

8. The nonvolatile semiconductor memory device as claimed in claim 1, characterized in that said check circuit checks the threshold of said first reference cell in response to power-on of said nonvolatile semiconductor memory device.

9. The nonvolatile semiconductor memory device as claimed in claim 1, characterized by further comprising
   a control circuit configured to prohibit an erase operation and a write operation with respect to said memory cell while the threshold of said first reference cell is larger than the predetermined fixed value.

10. The nonvolatile semiconductor memory device as claimed in claim 1, characterized by comprising a plurality of memory units obtained by dividing an array of more than one said memory cell, said first reference cell being individually provided for a corresponding one of said memory units.

11. A nonvolatile semiconductor memory device, comprising:
    a memory cell to store data;
    a first reference cell;
    a check circuit to check a threshold of said first reference cell by comparing a cell current of the first reference cell with a cell current of a second unwritten reference cell; and
    an erase circuit to erase the data of said memory cell in response to detection by said check circuit that the threshold of said first reference cell is smaller than or substantially equal to a predetermined fixed value; and
    an internal clock that specifies predetermined time intervals at which said check circuit checks the threshold of said first reference cell.

12. The nonvolatile semiconductor memory device as claimed in claim 11, characterized by further comprising a control circuit configured to set the threshold of said first reference cell at a value larger than the predetermined fixed value by performing an operation for programming said first reference cell in conjunction with an operation for writing the data to said memory cell.

13. The nonvolatile semiconductor memory device as claimed in claim 12, characterized in that said control circuit adjusts an amount of electric current programmed to said first reference cell in response to an input from an exterior of said nonvolatile semiconductor memory device.

14. The nonvolatile semiconductor memory device as claimed in claim 11, characterized in that said first reference cell includes: a substrate; a tunnel oxide film formed on said substrate; and a floating gate formed on said tunnel oxide film, wherein a thickness of said tunnel oxide film is 5.0 nm or less.

15. The nonvolatile semiconductor memory device as claimed in claim 11, characterized by comprising a plurality of memory units obtained by dividing an array of more than one said memory cell, said first reference cell being individually provided for a corresponding one of said memory units.

16. A nonvolatile semiconductor memory device, comprising:
    a memory cell to store data;
    a first reference cell;
    a check circuit to check a threshold of said first reference cell by comparing a cell current of the first reference cell with a cell current of a second unwritten reference cell; and
    an erase circuit to erase the data of said memory cell in response to detection by said check circuit that the threshold of said first reference cell is smaller than or substantially equal to a predetermined fixed value; and
    a control circuit configured to prohibit an erase operation and a write operation with respect to said memory cell while the threshold of said first reference cell is larger than the predetermined fixed value.

17. The nonvolatile semiconductor memory device as claimed in claim 16, characterized by further comprising a control circuit configured to set the threshold of said first reference cell at a value larger than the predetermined fixed value by performing an operation for programming said first reference cell in conjunction with an operation for writing the data to said memory cell.

18. The nonvolatile semiconductor memory device as claimed in claim 17, characterized in that said control circuit adjusts an amount of electric current programmed to said first reference cell in response to an input from an exterior of said nonvolatile semiconductor memory device.

19. The nonvolatile semiconductor memory device as claimed in claim 16, characterized in that said first reference cell includes: a substrate; a tunnel oxide film formed on said substrate; and a floating gate formed on said tunnel oxide film, wherein a thickness of said tunnel oxide film is 5.0 nm or less.

20. The nonvolatile semiconductor memory device as claimed in claim 16, further comprising:
    an internal clock that specifies predetermined time intervals at which said check circuit checks the threshold of said first reference cell.

21. The nonvolatile semiconductor memory device as claimed in claim 16, characterized by comprising a plurality of memory units obtained by dividing an array of more than one said memory cell, said first reference cell being individually provided for a corresponding one of said memory units.

* * * * *